United States Patent
Schultz et al.

(10) Patent No.: US 10,283,437 B2
(45) Date of Patent: May 7, 2019

(54) METAL DENSITY DISTRIBUTION FOR DOUBLE PATTERN LITHOGRAPHY

(71) Applicant: ADVANCED MICRO DEVICES, INC., Sunnyvale, CA (US)

(72) Inventors: Richard T. Schultz, Fort Collins, CO (US); Omid Rowhani, King (CA); Charles P. Tung, Westford, MA (US)

(73) Assignee: ADVANCED MICRO DEVICES, INC., Santa Clara, CA (US)

(*) Notice: Subject to any disclaimer, the term of this patent is extended or adjusted under 35 U.S.C. 154(b) by 645 days.

(21) Appl. No.: 13/686,184

(22) Filed: Nov. 27, 2012

(65) Prior Publication Data

US 2014/0145342 A1    May 29, 2014

(51) Int. Cl.
*G03F 7/20* (2006.01)
*H01L 23/48* (2006.01)
*H01L 21/311* (2006.01)
*G03F 7/00* (2006.01)

(52) U.S. Cl.
CPC ............ *H01L 23/48* (2013.01); *G03F 7/0035* (2013.01); *G03F 7/70466* (2013.01); *H01L 21/31144* (2013.01); *H01L 2924/0002* (2013.01)

(58) Field of Classification Search
CPC ............ G03F 7/70466; G03F 7/70475; G06F 17/5068; G06F 17/5072; G06F 17/5077; G06F 17/5081
USPC ....... 216/74; 257/773; 430/5, 311–314, 317; 438/671; 716/50–56, 120, 127
See application file for complete search history.

(56) References Cited

U.S. PATENT DOCUMENTS

| | | | |
|---|---|---|---|
| 8,589,831 B1 * | 11/2013 | Chang et al. | 716/55 |
| 2003/0157805 A1 * | 8/2003 | Schultz et al. | 438/694 |
| 2013/0174106 A1 * | 7/2013 | Hsu et al. | 716/55 |
| 2013/0236836 A1 * | 9/2013 | Sun et al. | 430/322 |
| 2014/0001638 A1 * | 1/2014 | Fu | H01L 21/768 257/773 |

* cited by examiner

*Primary Examiner* — Meiya Li
*Assistant Examiner* — Peter M Albrecht
(74) *Attorney, Agent, or Firm* — Park, Vaughan, Fleming & Dowler LLP

(57) ABSTRACT

Methods, a computer readable medium, and an apparatus are provided. A method includes and the computer readable medium is configured for decomposing an overall pattern into a first mask pattern that includes a power rail base pattern and into a second mask pattern, and generating on the second mask pattern a power rail insert pattern that is at least partially aligned with the power rail base pattern of the first mask pattern. The apparatus is produced by photolithography using photolithographic masks generated by the method.

14 Claims, 13 Drawing Sheets

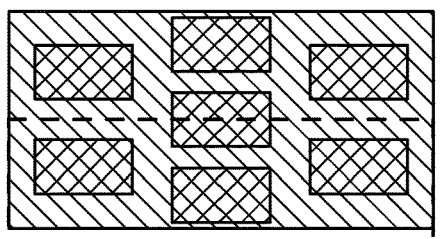
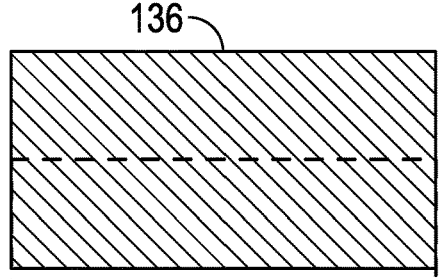
FIG. 3A                    FIG. 3B
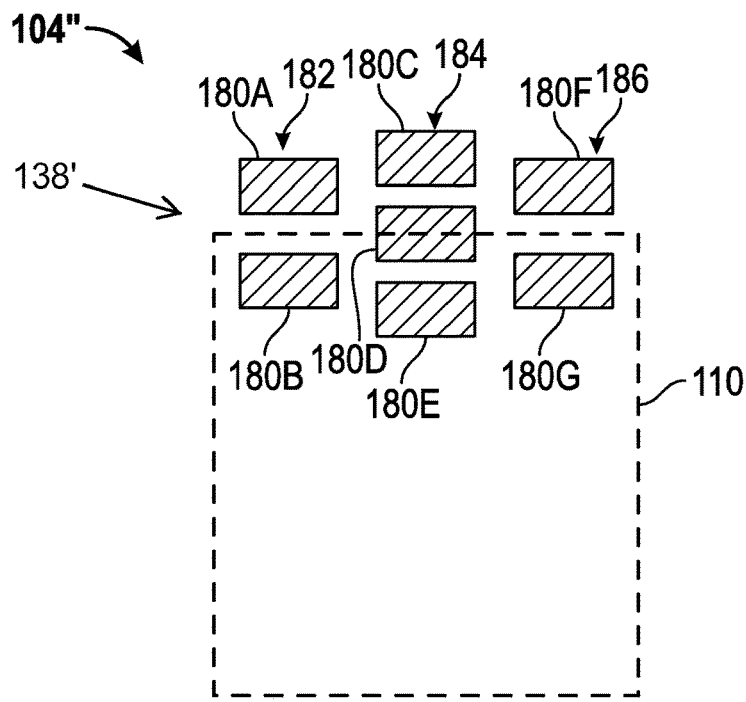
FIG. 3C

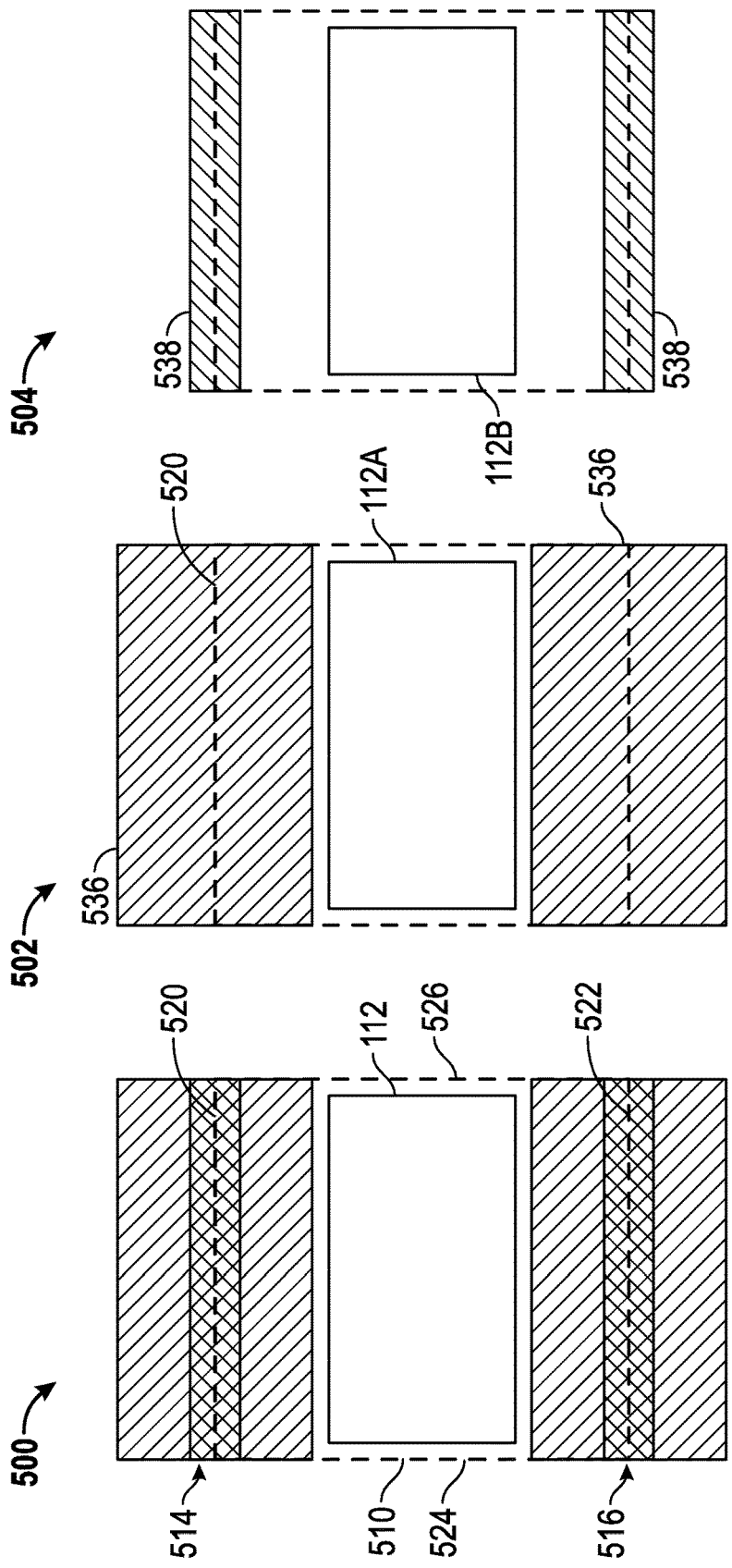

US 10,283,437 B2

METAL DENSITY DISTRIBUTION FOR DOUBLE PATTERN LITHOGRAPHY

TECHNICAL FIELD

The technical field relates generally to metal density distribution for double pattern lithography, and more particularly to a power rail architecture for double pattern lithography metal density distribution.

BACKGROUND

The semiconductor industry aims to manufacture integrated circuits with higher and higher densities of semiconductor devices on a smaller chip area to achieve greater functionality and to reduce manufacturing costs. This desire for large scale integration has led to a continued shrinking of circuit dimensions and device features. The ability to reduce the size of structures, such as gate lengths in field-effect transistors and the width of conductive lines, is driven by lithographic performance.

With conventional photolithography systems, radiation is provided through or reflected off a mask or reticle to form an image on a semiconductor wafer. Generally, the image is focused on the wafer to expose and pattern a layer of material, such as photoresist material. In turn, the photoresist material is utilized to define doping regions, deposition regions, etching regions, or other structures and features in one or more layers of the semiconductor wafer. The photoresist material can also define conductive lines or conductive pads associated with metal layers of a semiconductor device. Further, the photoresist material can define isolation regions, transistor gates, or other transistor structures and elements.

A multiple exposure/pattern process utilizes two or more photolithographic sub-processes and two or more photomasks and can be used to form patterns of extremely small and tightly packed features. A pitch or distance between lines on a photomask must be greater than a certain amount for a given wavelength and aperture of a lens used in the photolithographic process.

Downward scaling of pitch or line separation is ultimately limited by the practical performance capabilities of the photolithographic tools. Consequently, certain design rules are commonly used to check the viability and manufacturability of desired semiconductor device features. For example, design rule check (DRC) methodologies can be applied to identify potential tip-to-tip and/or tip-to-line violations in a proposed layout of conductive traces, such as local interconnects. Thus, if the proposed layout includes tip-to-tip or tip-to-line spacing that is too short for the particular photolithographic tool, then it may not be possible to fabricate devices using that proposed layout without shorting some conductive traces together. Limits on overlap or stitch length may also be imposed in various photolithographic processes. The stitch length is the length of overlapping patterned area that exists on both photomasks.

Furthermore, an exposure dose balance—which is a balance of an amount of light passing through each photomask—impacts process control on a critical dimension wire width during manufacturing. Unbalanced exposure doses may cause wires that are too narrow or too wide and lead to shorted wires or undesirable gaps or voids. For example, typical designs may include large conductive areas known as power rails that provide current to or from a functional unit of the design. The power rails are typically patterned on a single mask and therefore result in a large skew towards a higher dose density distribution on the photomask with the power rail. The decreased process control from the skew results in a printed product that may include features and lines that vary considerably from the desired design.

SUMMARY OF EMBODIMENTS

In some embodiments, a method includes decomposing the overall pattern into a first mask pattern that includes a power rail base pattern and into a second mask pattern, and generating on the second mask pattern a power rail insert pattern that is at least partially aligned with the power rail base pattern of the first mask pattern.

In some embodiments, a non-transitory computer readable medium storing control logic for execution by at least one processor of a computer system is provided. The control logic comprises instructions including code and data structures to decompose an overall pattern into a first mask pattern that includes a power rail base pattern and into a second mask pattern that includes a first interconnect pattern of a plurality of interconnect patterns, determine a distance between the power rail pattern and the first interconnect pattern, and generate on the second mask pattern a power rail insert pattern that is based on the distance and that is at least partially aligned with the power rail base pattern of the first mask pattern.

In some embodiments, a method of fabricating a semiconductor is provided. The method includes providing a semiconductor wafer, providing a first photolithographic mask that includes a first image having a power rail base pattern, transferring the first image onto the wafer, providing a second photolithographic mask that includes a second image having a power rail insert pattern disposed to align within the power rail base pattern of the first photolithographic mask, transferring the second image onto the wafer, etching a plurality of trenches in the wafer using the transferred images as an etch mask, and depositing a conductive material in the trenches of the wafer to print a power rail.

In some embodiments, an apparatus including a semiconductor with a first layer is provided. The first layer is produced by the process of providing a first photolithographic mask that includes a first image having a power rail base pattern, transferring the first image onto the wafer, providing a second photolithographic mask that includes a second image having a power rail insert pattern disposed to align within the power rail base pattern of the first photolithographic mask, transferring the second image onto the wafer, etching a plurality of trenches in the wafer using the transferred images as an etch mask, and depositing a conductive material in the trenches of the wafer to print a power rail.

BRIEF DESCRIPTION OF THE DRAWINGS

Advantages of the embodiments disclosed herein will be readily appreciated, as the same becomes better understood by reference to the following detailed description when considered in connection with the accompanying drawings wherein:

FIG. 3A is a simplified block diagram of a power rail pattern according to some embodiments;

FIG. 3B is a simplified block diagram of a mask pattern according to some embodiments;

FIG. 3C is a simplified block diagram of a mask pattern according to some embodiments;

FIG. 5A is a simplified block diagram of an overall mask pattern according to some embodiments;

FIG. 5B is a simplified block diagram of a mask pattern according to some embodiments;

FIG. 5C is a simplified block diagram of a mask pattern according to some embodiments;

DETAILED DESCRIPTION

Figure 1A:
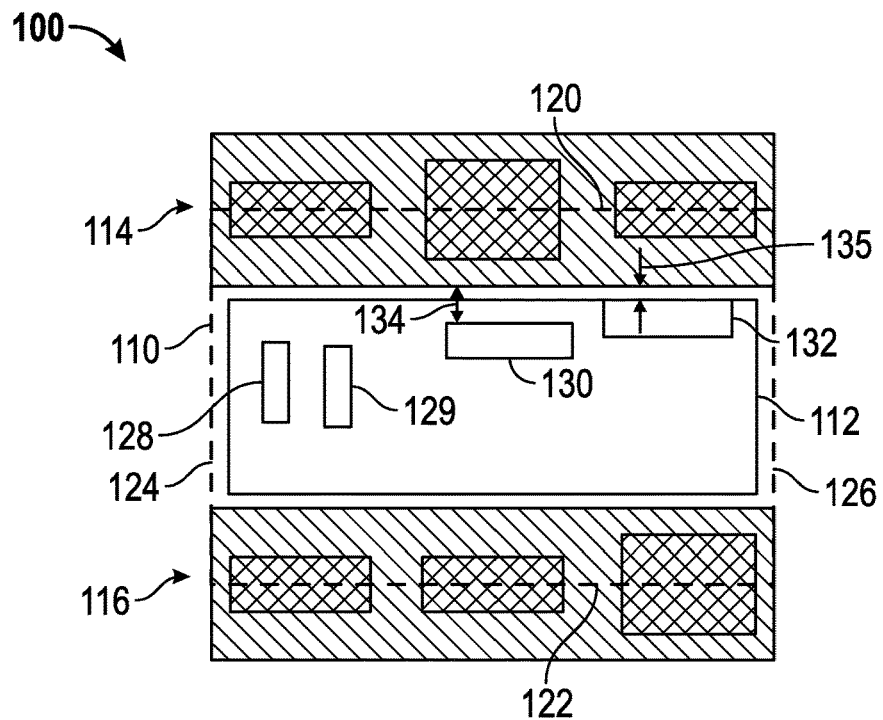
FIG. 1A is a simplified block diagram of an overall mask pattern according to some embodiments.

The following detailed description is merely exemplary in nature and is not intended to limit application and uses. As used herein, the word "exemplary" means "serving as an example, instance, or illustration." Thus, any embodiments described herein as "exemplary" are not necessarily to be construed as preferred or advantageous over other embodiments. All of the embodiments described herein are exemplary embodiments provided to enable persons skilled in the art to make or use the disclosed embodiments and not to limit the scope of the disclosure which is defined by the claims. Furthermore, there is no intention to be bound by any expressed or implied theory presented in the preceding technical field, background, brief summary, the following detailed description or for any particular embodiment or computer system.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. Additionally, the following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that, although two elements may be described below as being "connected," these elements may be "coupled," and vice versa. Thus, although the block diagrams shown herein depict example arrangements of elements, additional intervening elements, devices, features, or components may be present in actual embodiments.

Finally, for the sake of brevity, conventional techniques and components related to computer systems and other functional aspects of a computer system (and the individual operating components of the system) may not be described in detail herein. Furthermore, the connecting lines shown in the various figures contained herein are intended to represent example functional relationships and/or physical couplings between the various elements. It should be noted that many alternative or additional functional relationships or physical connections may be present in the embodiments disclosed herein.

In some embodiments, an improved exposure dose manufacturing method and semiconductor product is provided. Other desirable features and characteristics of the present invention will become apparent from the subsequent detailed description and the appended claims, taken in conjunction with the accompanying drawings.

Photolithography and various photolithographic techniques are used during the manufacture of semiconductor devices. Such techniques may be used to form patterns of photoresist material on a semiconductor wafer, where such patterns define the boundaries of features, regions, and/or areas to be formed, treated, or processed. For example, photolithography may be used to define a layout of power rails, local interconnects, active semiconductor regions, gate structures, sidewall spacers, etch masks, ion implantation masks, or the like. In this regard, a typical photolithographic system employs a radiation source, optics (e.g., a lens, mirror, or liquid such as water), a mask, and a stage for the wafer undergoing photolithography. Such a photolithographic system is configured to transfer a pattern or image provided on the mask to a target material or surface of the wafer.

A photoresist layer is formed overlying the intended target material of the wafer. The target material can be an insulative layer, a conductive layer, a barrier layer, or any target material to be etched, doped, treated, processed, or layered. For example, the target material could be, without limitation: polycrystalline silicon; a silicide material; a hard mask layer such as a silicon nitride material; an anti-reflective coating; or any suitable conductive, semiconductive, or insulative material. The photoresist layer may include a variety of photoresist materials, compositions, or chemicals suitable for lithographic applications. The photoresist layer is selected to have photochemical reactions in response to electromagnetic radiation emitted from a radiation source, and to have sufficient transparency to the electromagnetic radiation to allow useful patterning of the photoresist layer. Materials suitable for the photoresist layer may include, among others, a matrix material or resin, a sensitizer or inhibitor, and a solvent. The photoresist layer may be a chemically amplified, positive or negative tone, organic-based photoresist. The photoresist layer may also be a silicon-containing photoresist. For example, the photoresist layer may be an acrylate-based polymer, an alicyclic-based polymer, a phenolic-based polymer, or other suitable materials.

For the various embodiments described here, a layer of photoresist material may be formed over a target material or layer of a semiconductor device structure using any suitable technique, for example, deposition by spin coating. The thickness of a given photoresist layer is selected according to the particular lithographic technology, e.g., for use in vacuum ultraviolet (VUV) lithography, deep ultraviolet (DUV) lithography, and/or extreme ultraviolet (EUV) lithography (using, for example, exposing light having a wavelength of 193 nm, 157 nm, 126 nm, or 13.4 nm). In this regard, a particular photoresist layer may have a thickness in the range of 15-1000 nm, with a preferred thickness in the range of 50-500 nm.

The optics used by a photolithography system are suitably configured to focus and direct a pattern of radiation (i.e., radiation from the radiation source as modified by a pattern or image provided on a mask) onto a photoresist layer. In some embodiments, the mask is a binary mask that includes a transparent or translucent substrate (e.g., glass or quartz) and an opaque or patterned layer thereon. The opaque layer provides a pattern or image associated with a desired circuit pattern, features, or devices to be projected onto the photoresist layer. In some embodiments, the substrate may have an opaque layer that defines a transparent pattern or image associated with the desired circuit pattern. In some embodiments, the mask may be an attenuating phase shift mask, an alternating phase shift mask, or other type of mask.

Referring now to FIG. 1A, a simplified block diagram of an overall mask pattern 100 is illustrated according to some embodiments. The overall mask pattern 100 is generally a computer generated representation of an integrated circuit. The overall mask pattern 100 may be created in a modeling and simulation environment for fabricating the integrated circuit using metal double pattern lithography. Various double pattern techniques may be used, such as litho-etch, litho-etch-etch (LELEE), Litho-etch, litho-etch, or a litho-freeze-litho-etch process (LFLE). LELEE forms a nitride layer over an oxide layer, forms a first photoresist pattern, etches the nitride layer using the first photoresist pattern, subsequently forms a second photoresist pattern, etches the nitride layer using the second photoresist pattern, and then etches the oxide layer using the etched pattern in the nitride layer as an etch mask, as will be described below with reference to FIG. 11. The LFLE process forms a first photoresist layer, exposes and develops the first photoresist layer, freezes the first photo resist layer, coats the first photoresist pattern with a second photoresist layer, exposes and develops the second photoresist layer, and then etches the wafer. In some embodiments, other lithographic processes and more than two photomasks are utilized.

Figure 1B:
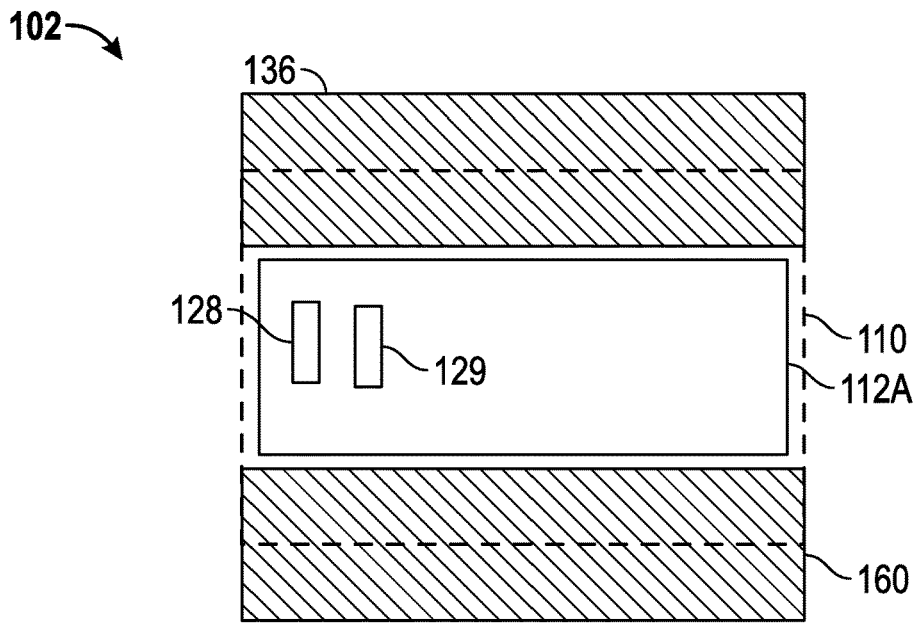
FIG. 1B is a simplified block diagram of a mask pattern according to some embodiments.
Figure 1C:
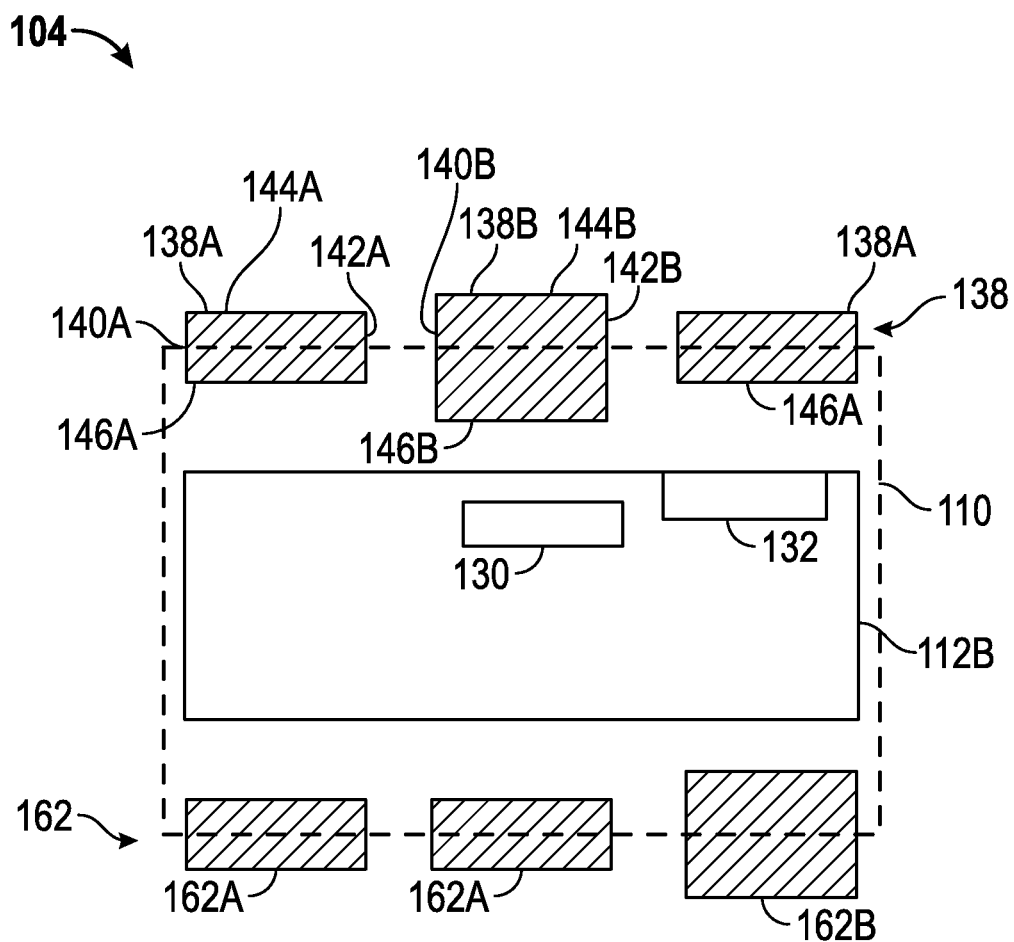
FIG. 1C is a simplified block diagram of a mask pattern according to some embodiments.

The overall mask pattern 100 represents a layout of features on a layer of a semiconductor device, such as an "M1" or metal one layer. The pattern of the overall mask pattern 100 is decomposed into a first mask pattern 102 as illustrated in FIG. 1B and a second mask pattern 104 as illustrated in FIG. 1C. The mask patterns 102, 104 may be incorporated into photomasks and separately exposed on one or more resists as part of the lithographic process to print a final pattern on a single layer of a semiconductor device. The mask patterns may represent any type of mask for use in the lithographic process, such as a positive photomask or a negative photomask.

The mask patterns 102, 104 may be designed or modeled in a simulation environment and may be displayed using different colors. For example, the first mask pattern 102 includes an image or pattern that is represented by the color blue in the simulation environment and the second mask pattern 104 includes an image or pattern that is represented by the color pink in the simulation environment. Distribution of pink and blue patterns in the overall mask pattern 100 impacts the exposure dose and critical dimension control of an integrated circuit that is fabricated using the first and second mask patterns 102, 104.

The overall mask pattern 100 includes a cell 110, an internal portion 112, a first power rail pattern 114, and a second power rail pattern 116. The cell 110 defines a repeatable unit of a semiconductor device layer. For example, the cell 110 may include I/O logic, mixed signal logic, digital library logic, Static Random Access Memory with periodic power bus rails, or other digital logic. A boundary of the cell 110 is defined by a first edge 120, a second edge 122, a third edge 124, and a fourth edge 126. The first edge 120 is parallel with and spaced apart from the second edge 122. The third edge 124 is parallel with and spaced apart from the fourth edge 126. The first and second edges 120, 122 are perpendicular to the third and fourth edges 124, 126 to define a rectangular shaped cell 110. In the example provided, the first edge 120 bisects the first power rail pattern 114 and the second edge 122 bisects the second power rail pattern 116.

The internal portion 112 includes a plurality of metal line or interconnect patterns 128, 129, 130, 132. The interconnect patterns define locations where conductive areas are to be placed on the integrated circuit to electrically connect various components of the integrated circuit. Any number or size of interconnects may be included in the internal portion 112. The interconnect patterns 128, 129, 130, 132 of the internal portion 112 are decomposed into a first internal pattern 112A on the first mask pattern 102 and a second internal pattern 112B on the second mask pattern 104. The interconnect patterns 128, 129 are decomposed onto the first internal pattern 112A on the first mask pattern 102 and the interconnect patterns 130, 132 are decomposed onto the second internal pattern 112B on the second mask pattern 104. The interconnect patterns 130, 132 of the second internal pattern 112B may be various distances from the power rail patterns 114, 116. For example, the interconnect pattern 130 is separated from the first power rail pattern 114 by a first distance 134 and the interconnect pattern 132 is separated from the first power rail pattern 114 by a second distance 135 that is less than the first distance.

The first power rail pattern 114 is decomposed into a base pattern 136 on the first mask pattern 102 and an insert pattern 138 on the second mask pattern 104. The power rail pattern 114 is a design of a conductive material that will be printed on the integrated circuit to supply power to or return power from the elements of the cell 110. The base pattern 136 is generally rectangular in shape and bounded by the third and fourth edges 124, 126 of the cell 110 in a longitudinal direction. In the example provided, the base pattern 136 is centered on the first edge 120 of the cell 110 along a transverse direction of the base pattern 136. A width of the base pattern 136 in the transverse direction may be selected based on the electrical current demands of the cell 110.

The insert pattern 138 includes narrow inserts 138A and wide inserts 138B. In general, the narrow inserts 138A and wide inserts 138B overlay the base pattern 136 in the overall mask pattern 100 to improve exposure dose balance. An allowed overlap or stitch length of a pattern on the first mask 102 and a pattern on the second mask 104 may be limited by design rules under various lithographic techniques. Accordingly, by splitting the insert pattern 138 into multiple inserts 138A-B, the stitch length overlap may be reduced to promote design rule compliance. Selection between the narrow inserts 138A and the wide inserts 138B is determined by a distance between the power rail 114 and the nearest interconnect 130, 132 of the internal pattern 112B, as will be explained below. It should be appreciated that the inserts 138A-B may be included in any number and may have other lengths and widths. In the example provided the inserts are generally rectangular in shape. Each of the narrow inserts 138A has a first edge 140A, a second edge 142A, a third edge 144A, and a fourth edge 146A. Each of the wide inserts 138B has a first edge 140B, a second edge 142B, a third edge 144B, and a fourth edge 146B. Each of the first edges 140A-B and second edges 142A-B of the inserts 138A-B is centered on the first edge 120 of the cell 110. The edges 140A-B, 142A-B are parallel with a transverse direction of the inserts 138A-B. A length of the edges 140A, 142A of the narrow inserts 138A is less than a length of the edges 140B, 142B of the wide inserts 138B. Each of the first edges 140A-B is separated from each adjacent second edge 142A-B such that there is a gap between adjacent inserts 138A-B. The gap size is equal to or larger than the minimum pitch of the lithography process for the second mask 104.

The third edges 144A-B and fourth edges 146A-B are parallel with a longitudinal direction of the power rail pattern 114. The third and fourth edges 144A, 146A of the narrow inserts 138A are closer to the first edge 120 of the cell 110 than are the third and fourth edges 144B, 146B of the wide inserts 138B. A distance between the edge 146B and the nearest interconnect 130 of the mask 104 that is longitudinally aligned with the wide insert 138B is equal to or larger than the minimum pitch distance for the mask 104. Similarly, a distance between the fourth edge 146A of the narrow insert 138A and the nearest interconnect 132 of the mask 104 that is longitudinally aligned with the narrow insert 138A is equal to or larger than the minimum pitch distance for the mask 104. The insert pattern 138 is patterned within an area of the base pattern 136 to promote exposure dose balance and improve process control and critical dimension uniformity when fabricating the integrated circuit that incorporates the overall mask pattern 100.

The second power rail pattern 116 decomposes into a base pattern 160 on the first mask pattern 102 and an insert pattern 162 on the second mask pattern 104. The base pattern 160 is generally rectangular in shape and bounded by the third and fourth edges 124, 126 of the cell 110 in a longitudinal direction. In the example provided, the base pattern 160 is centered on the second edge 122 of the cell 110 along a transverse direction of the base pattern 160. The insert pattern 162 includes narrow inserts 162A and wide inserts 162B. Selection of the narrow inserts 162A and the wide inserts 162B is substantially similar to the selection of the inserts 138A-B of the first power rail pattern 114 with reference to interconnects adjacent the second power rail pattern 116.

Figure 2A:
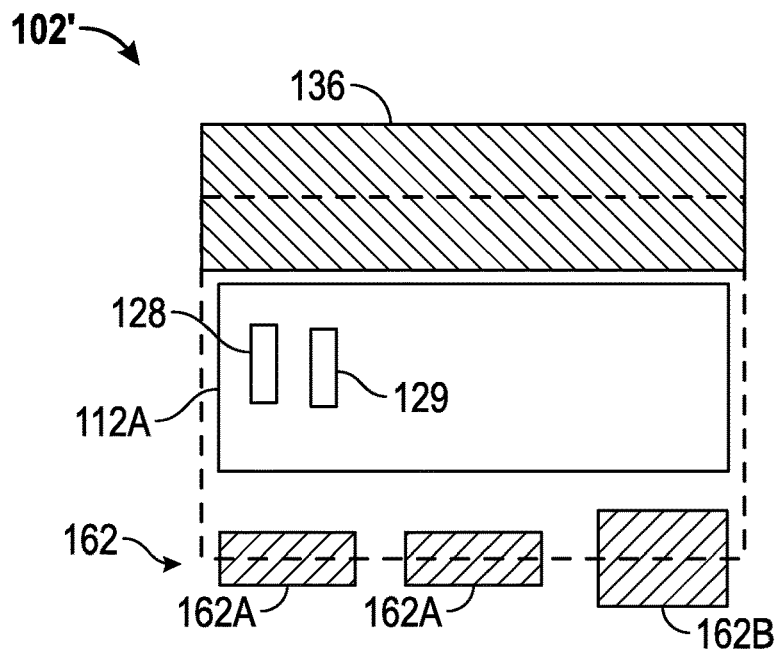
FIG. 2A is a simplified block diagram of a mask pattern according to some embodiments.
Figure 2B:
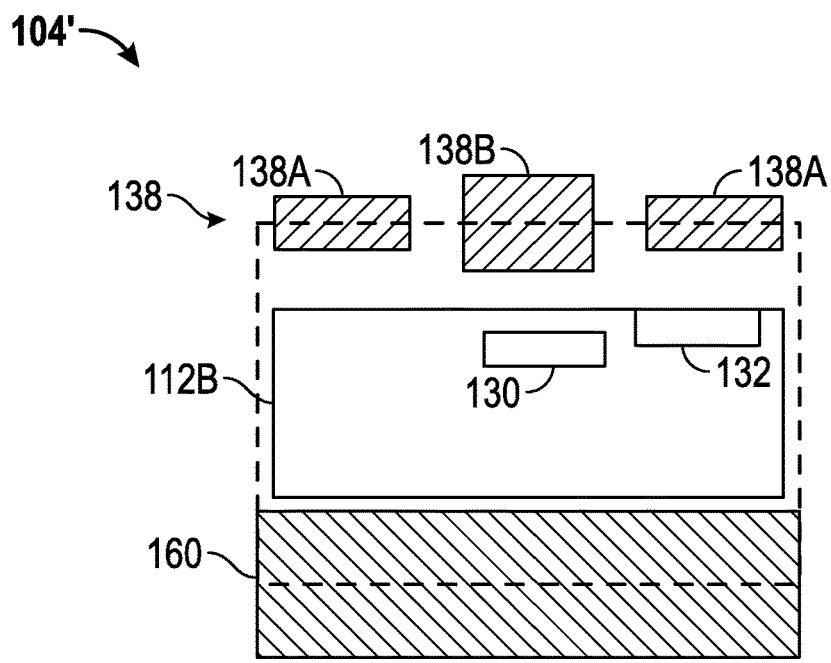
FIG. 2B is a simplified block diagram of a mask pattern according to some embodiments.

Referring now to FIGS. 2A and 2B, a first mask 102' and a second mask 104' are illustrated in accordance with some embodiments. The first mask pattern 102' as illustrated in FIG. 2A and the second mask pattern 104' as illustrated in FIG. 2B are substantially similar to the first mask pattern 102 and the second mask pattern 104, where like numbers refer to like components. The first mask pattern 102' and the second mask pattern 104' may be combined to produce the overall pattern 100 as illustrated in FIG. 1A. The first mask pattern 102' includes the base pattern 136 for the first power rail pattern 114 and the insert pattern 162 for the second power rail pattern 116. The second mask pattern 104' includes the insert pattern 138 for the first power rail pattern 114 and the base pattern 160 for the second power rail pattern 116.

Referring now to FIG. 3A, a power rail pattern 114' is illustrated in accordance with some embodiments. The power rail pattern 114' decomposes into a first mask pattern 102" illustrated in FIG. 3B and a second mask pattern 104" illustrated in FIG. 3C. The power rail pattern 114' decomposes into the base pattern 136 on the first mask pattern 102" and an insert pattern 138' on the second mask pattern 104". The insert pattern 138' includes a plurality of inserts 180A-G on the second mask pattern 104". The inserts 180A-B form a first narrow insert pattern 182, the inserts 180C-E form a wide insert pattern 184, and the inserts 180E-G form a second narrow insert pattern 186. It should be appreciated that other numbers and widths of input patterns may be selected to improve exposure dose balance and conform to stitch length design rules.

Figure 4:
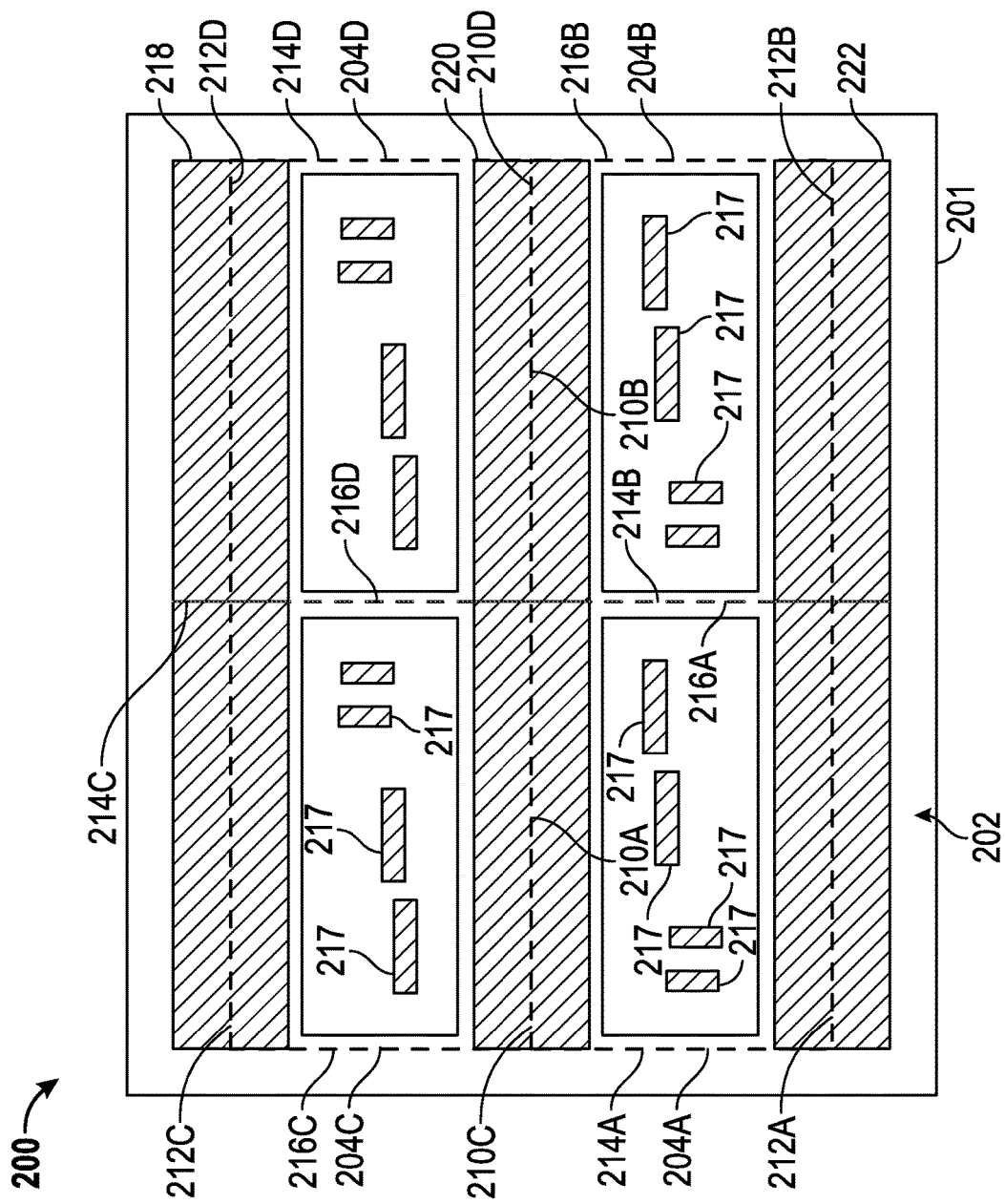
FIG. 4 is a simplified block diagram of an apparatus according to some embodiments.

Referring now to FIG. 4, a simplified block diagram illustrates an apparatus 200 according to some embodiments. The apparatus 200 includes a semiconductor device 201 that has a metal layer 202. In the example provided, the metal layer 202 includes is a layer that includes a first cell 204A, a second cell 204B, a third cell 204C, and a fourth cell 204D. The cells 204A-D may be printed on the metal layer 202 using, for example, photolithographic masks that include the first and second mask patterns 102 and 104, as will be described below with reference to FIG. 11. The cells 204A-D have first edges 210A-D, second edges 212A-D, third edges 214A-D, and fourth edges 216A-D. The first and second cells 204A-B are arranged so that the fourth edge 216A of the first cell 204A is aligned with the third edge 214B of the second cell 204B. The third cell 204C and the fourth cell 204D are "flipped" and "mirrored." In other words, the first edges 210C-D of the third and fourth cells 204C-D are collinear with the first edges 210A-B of the first and second cells 204A-B. The cells 204A-D each include interconnects 217 that are printed using the interconnect patterns 128, 129, 130, 132, as will be described below with reference to FIG. 11.

The metal layer 202 further includes a first power rail 218, a second power rail 220, and a third power rail 222. The power rails 218, 220, 222 include an electrically conductive material that have been formed by double pattern lithography using a first photomask that includes a power rail base pattern (e.g., the base pattern 136 of FIG. 1B) and a second photomask that includes a power rail insert base pattern (e.g., the insert pattern 138 of FIG. 1C or 138' of FIG. 3C). In the example provided, the metal layer 202 is produced by the method illustrated in FIG. 11, as discussed below.

Figure 11:
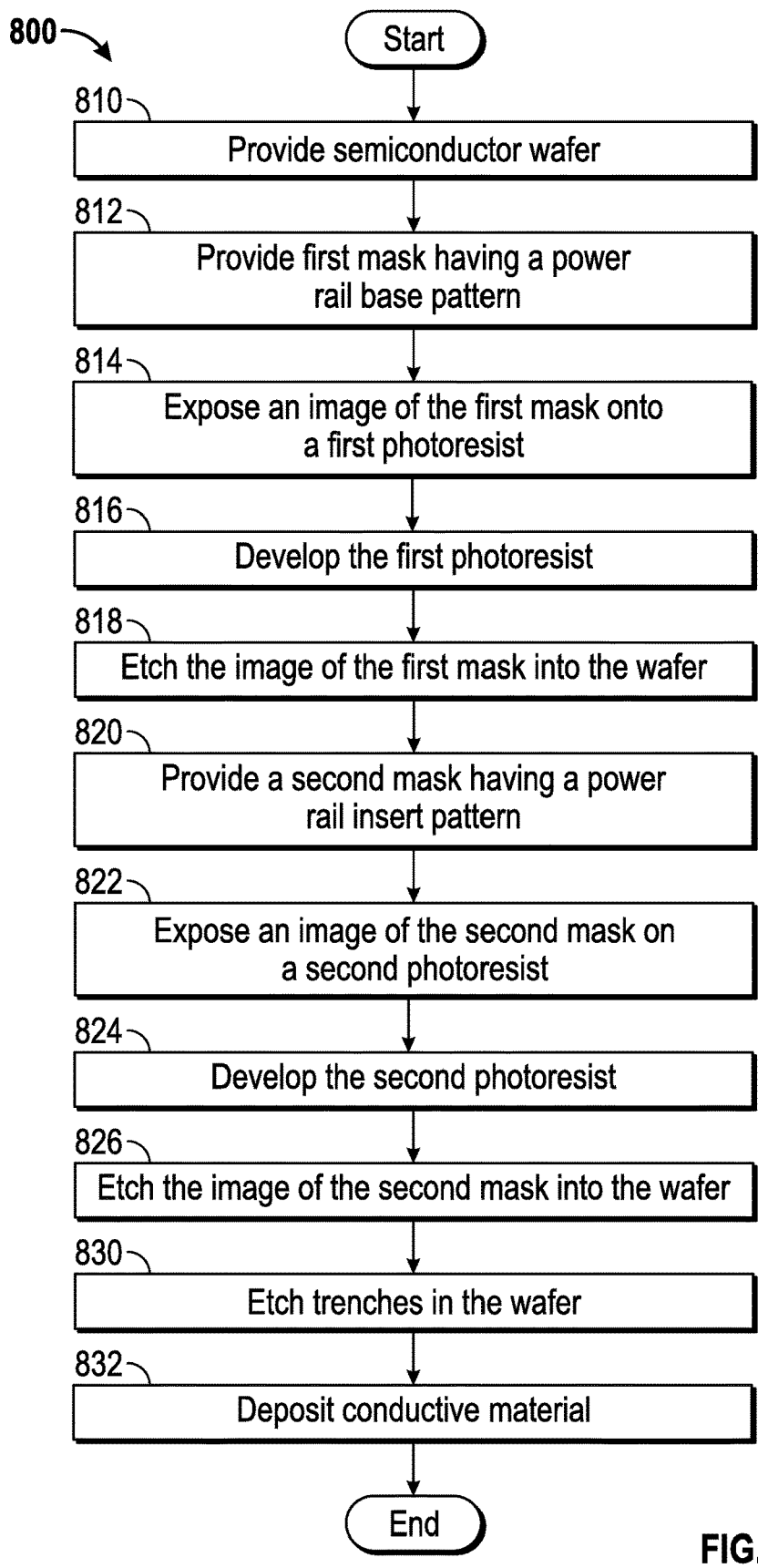
FIG. 11 is a flow diagram illustrating a method according to embodiments

Production of the metal layer 202 by the manufacturing process steps illustrated in FIG. 11 imparts distinctive structural characteristics to the final product. For example, uniformity of critical dimensions on the metal layer 202 is improved. Additionally, when compared with a power rail that was patterned on only one mask, a power rail that is printed using the first power rail 114 pattern may have a different cross section that includes a "stepped" or multiple level or depth trench due to the multiple etching processes. For example, the hard mask layer may be exposed to multiple etch processes where the insert pattern overlies the base rail pattern, which may result in the stepped trench at the location of the insert pattern. Furthermore, where adjacent cells include power rail patterns that are patterned on different masks (e.g., FIG. 8A-C, FIG. 9A-B as described below), there may be a slight shift on the power rail due to mask misalignment that is visible with a scanning electron microscope.

Referring now to FIGS. 5A, 5B, and 5C, an overall mask pattern 500 that represents a metal layer layout of a semiconductor device is illustrated in accordance with some embodiments. The overall mask pattern 500 decomposes into a first mask pattern 502 as illustrated in FIG. 5B and a second mask pattern 504 as illustrated in FIG. 5C. The overall mask pattern 500 includes a cell 510, the internal portion 512, a first power rail pattern 514, and a second power rail pattern 516. A boundary of the cell 510 is defined by a first edge 520, a second edge 522, a third edge 524, and a fourth edge 526. The first edge 520 is parallel to and spaced apart from the second edge 522. The third edge 524 is parallel to and spaced apart from the fourth edge 526. The first and second edges 520, 522 are perpendicular to the third and fourth edges 524, 526 to define a rectangular shaped cell 510.

The first power rail pattern 514 decomposes into a base pattern 536 on the first mask pattern 502 and an insert pattern 538 on the second mask pattern 504. The base pattern 536 and the insert pattern are centered on the first edge 520 of the cell 510 along a transverse direction of the first power rail pattern 514. The base pattern 536 is generally rectangular in shape and bounded by the third and fourth edges 524, 526 of the cell 510 in a longitudinal direction. The insert pattern 538 is generally rectangular in shape and bounded by the third and fourth edges 524, 526 of the cell 510 in a longitudinal direction. A width of the insert pattern 538 along a transverse direction of the first power rail pattern 514 is less than a width of the base pattern 536 along the transverse direction.

The second power rail pattern 516 decomposes into the base pattern 536 on the first mask pattern 502 and the insert pattern 538 on the second mask pattern 504. The patterns 536, 538 of the second power rail pattern 516 are centered on the second edge 522 of the cell 510 along a transverse direction of the second power rail pattern 516.

Figure 6A:
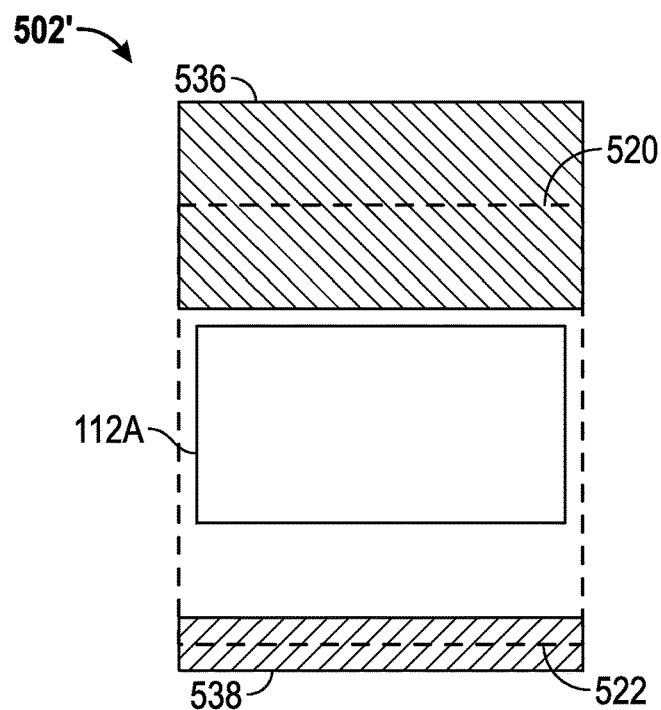
FIG. 6A is a simplified block diagram of a mask pattern according to some embodiments.
Figure 6B:
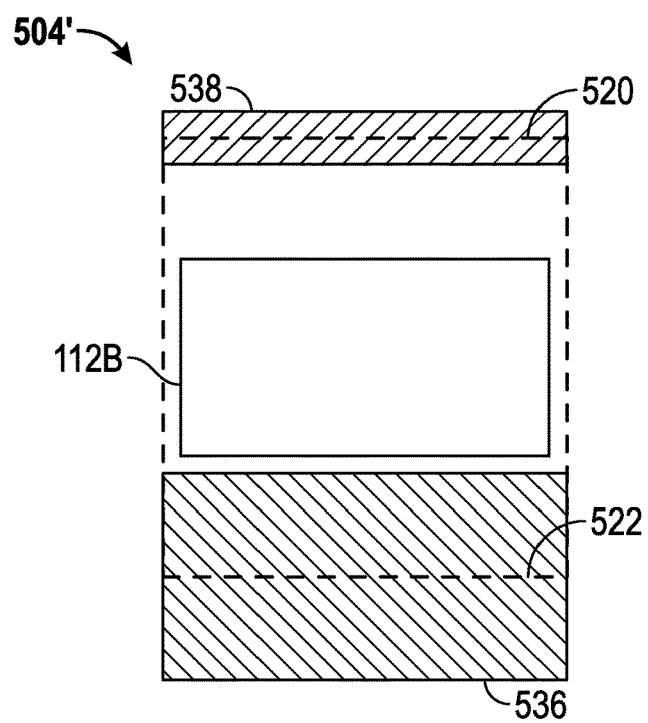
FIG. 6B is a simplified block diagram of a mask pattern according to some embodiments.

Referring now to FIGS. 6A and 6B, a first mask pattern 502' and a second mask pattern 504' are illustrated according to some embodiments. The first mask pattern 502' and the second mask pattern 504' are similar to the first mask pattern 502 and the second mask pattern 504, where like numbers refer to like components. For example, the first mask pattern 502' and the second mask pattern 504' are decomposed from the overall mask pattern 500. The first mask pattern 502', however, includes the base pattern 536 for the first power rail pattern 514 and the insert pattern 538 for the second power rail pattern 516. Accordingly, the second mask pattern 504' includes the insert pattern 538 for the first power rail pattern 514 and the base pattern 536 for the second power rail pattern 516.

Figure 7A:
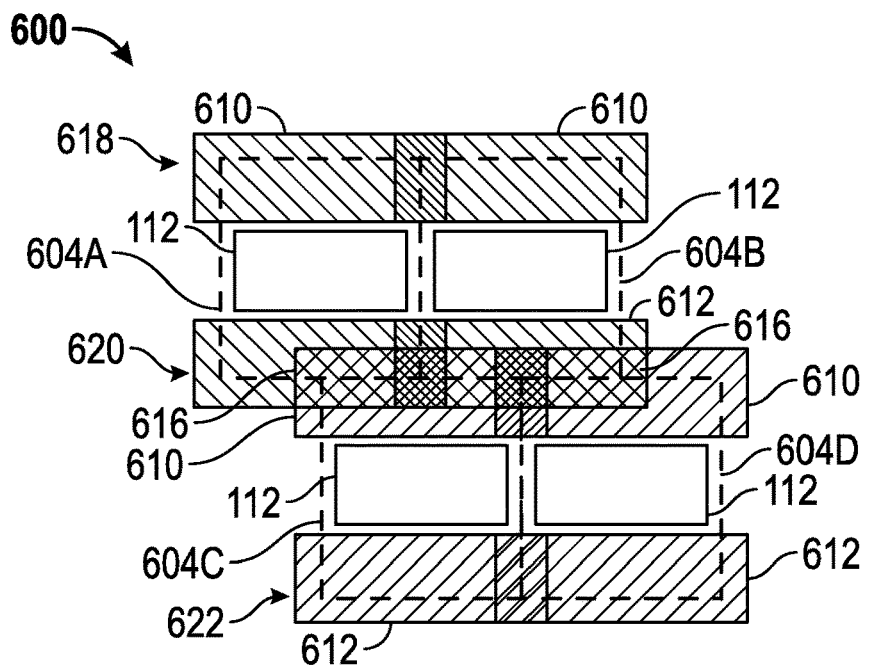
FIG. 7A is a simplified block diagram of an overall mask pattern according to some embodiments.
Figure 7B:
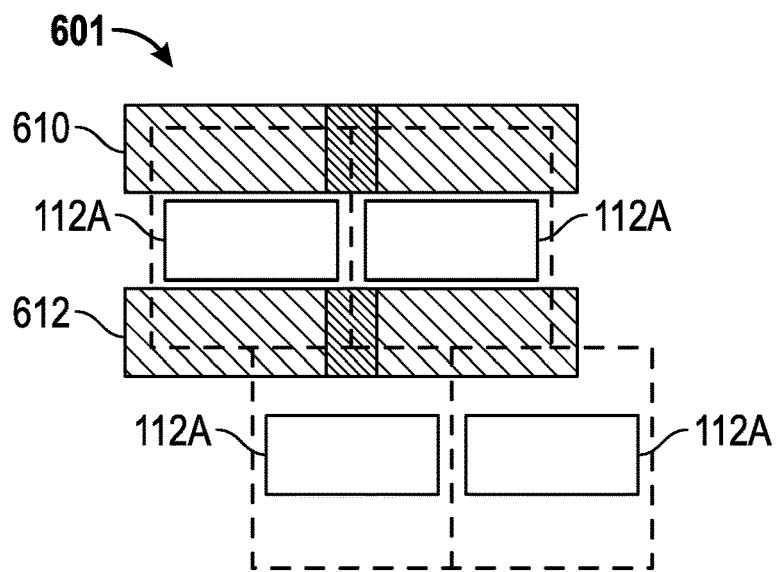
FIG. 7B is a simplified block diagram of a mask pattern according to some embodiments.
Figure 7C:
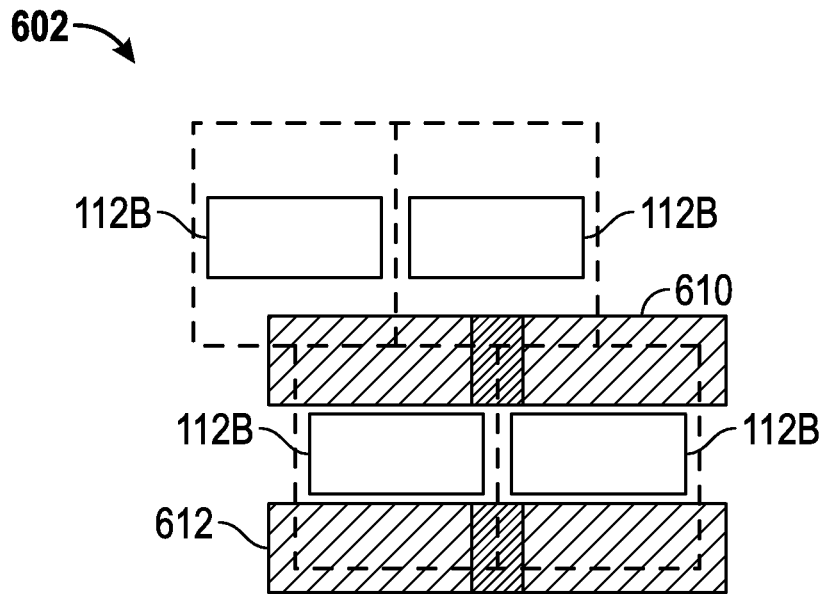
FIG. 7C is a simplified block diagram of a mask pattern according to some embodiments.

Referring now to FIGS. 7A, 7B, and 7C, simplified block diagrams illustrate an overall mask pattern 600 according to some embodiments. The overall mask pattern 600 decomposes into a first mask pattern 601 as illustrated in FIG. 7B and a second mask pattern 602 as illustrated in FIG. 7C. The overall mask pattern 600 includes a first cell 604A, a second cell 604B, a third cell 604C, and a fourth cell 604D. The cells 604A-D each include the internal portion 112 as described above with reference to the cell 110.

Each of the cells 604A-D includes a first power rail pattern 610 and a second power rail pattern 612. The power rail patterns 610, 612 are generally rectangular in shape and are disposed at end portions of each of the cells 604A-D. The first and second power rail patterns 610, 612 of the first and second cells 604A-B are patterned on the first mask pattern 601 and the first and second power rail patterns 610, 612 of the third and fourth cells 604C-D are patterned on the second mask pattern 602.

The power rail patterns 610, 612 of the cells 604A-D overlap to form a first power rail 618, a second power rail 620, and a third power rail 622. The first power rail 618 includes the first power rail pattern 610 of the first cell 604A and the first power rail pattern 610 of the second cell 604B. The second power rail 620 includes the second power rail patterns 612 of the first and second cells 604A-B and the first power rail pattern 610 of the third and fourth cells 604C-D. The second rail patterns 612 on the first mask pattern 601 overlap the first rail patterns 610 on the second mask pattern 602 at a stitch portion 616. A size of the stitch portion 616 may be selected to account for printing variations of the lithographic process to reduce a risk of gaps between the first rail patterns 610 and the second rail patterns 612 when the overall mask pattern 600 is printed in a lithographic process. The third power rail 622 includes the second rail patterns 612 of the third and fourth cells 604C-D.

Figure 8A:
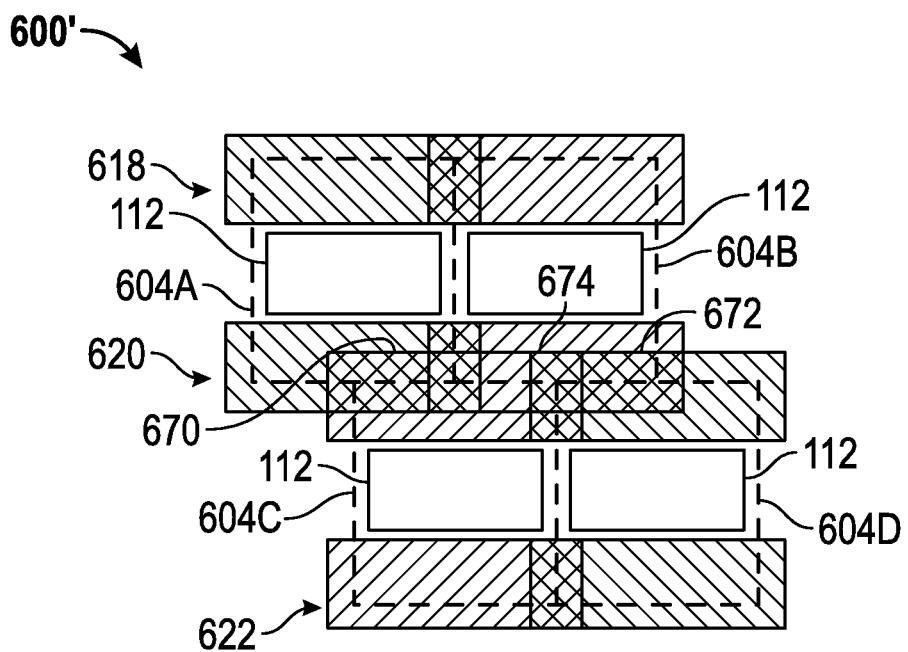
FIG. 8A is a simplified block diagram of an overall mask pattern according to some embodiments.
Figure 8B:
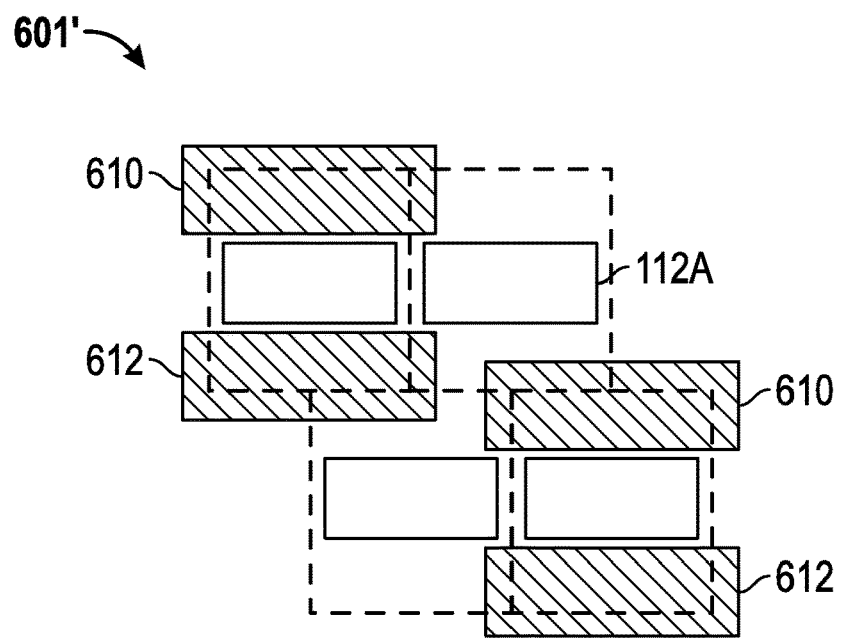
FIG. 8B is a simplified block diagram of a mask pattern according to some embodiments.
Figure 8C:
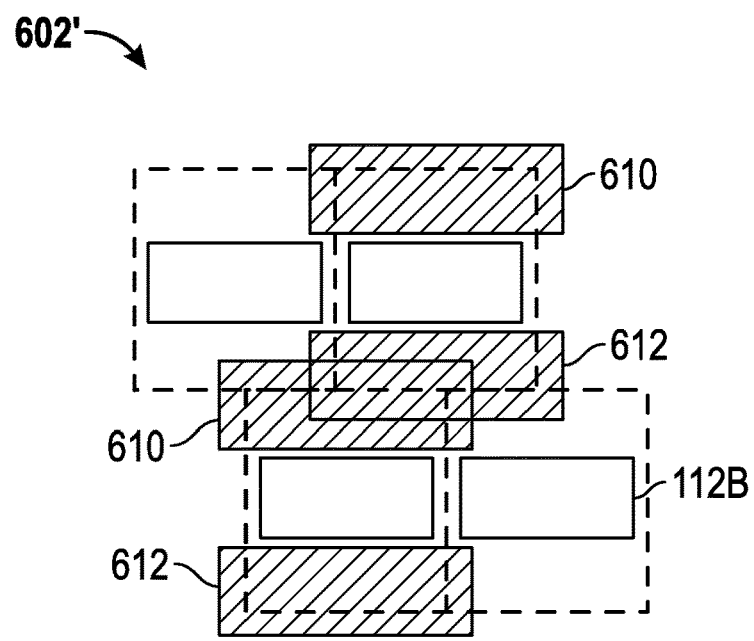
FIG. 8C is a simplified block diagram of a mask pattern according to some embodiments.

Referring now to FIGS. 8A, 8B, and 8C, simplified block diagrams illustrate an overall mask pattern 600' according to some embodiments. The overall mask pattern 600' is similar to the overall mask pattern 600, where like numbers refer to like components. The overall mask pattern 600' decomposes into a first mask pattern 601' as illustrated in FIG. 8B and a second mask pattern 602' as illustrated in FIG. 8C.

The first and second power rail patterns 610, 612 of the first and fourth cells 604A, 604D are patterned on the first mask pattern 601' and the first and second power rail patterns 610, 612 of the second and third cells 604B-C are patterned on the second mask pattern 602'. The patterns 610, 612 of the first and second mask patterns 601', 602' overlap to form a first stitch pattern 670 and a second stitch pattern 672. The first and second stitch patterns 670, 672 are "L" shaped and are separated by a gap portion 674 that includes only the patterns 610, 612 that are on the second mask pattern 602'. The overall mask pattern pattern 600' may be used, for example, when the stitching rules of the lithographic process do not restrict use of the stitch patterns 670, 672.

Figure 9A:
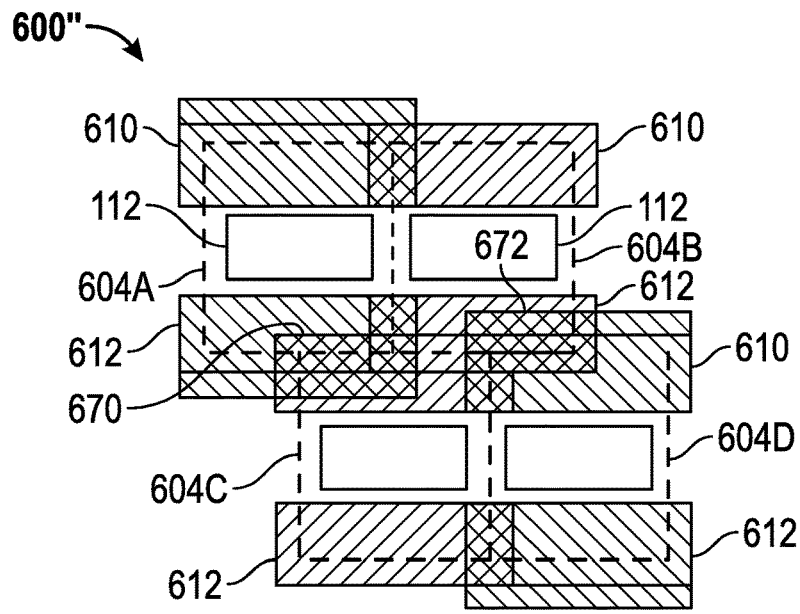
FIG. 9A is a simplified block diagram of an overall mask pattern according to some embodiments.
Figure 9B:
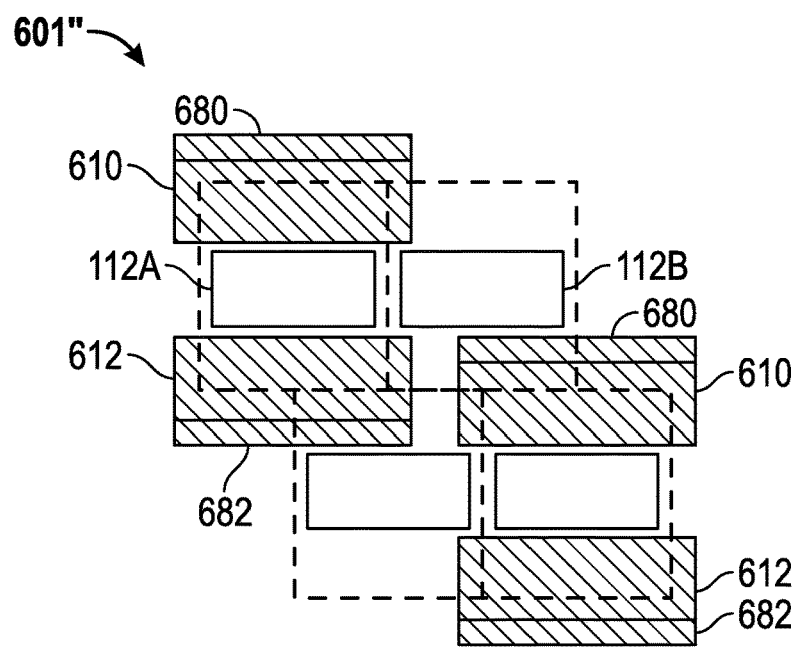
FIG. 9B is a simplified block diagram of a mask pattern according to some embodiments.

Referring now to FIGS. 9A and 9B, simplified block diagrams illustrate an overall mask pattern 600" according to some embodiments. The overall mask pattern 600" is similar to the overall mask pattern 600', where like numbers refer to like components. The overall mask pattern 600" into a first mask pattern 601" as illustrated in FIG. 9B and the second mask pattern 602'. The first mask pattern 601" includes a first tile overlay 680 and a second tile overlay 682 abutting the first and second power rails 610, 612, respectively, of the first and fourth cells 604A, 604D. The overall mask pattern 600" may be used, for example, when stitching rules of the lithographic process do not restrict use of the stitch patterns 670, 672 and additional patterning on the first mask pattern 601" is desirable to improve exposure dose balance.

Figure 10:
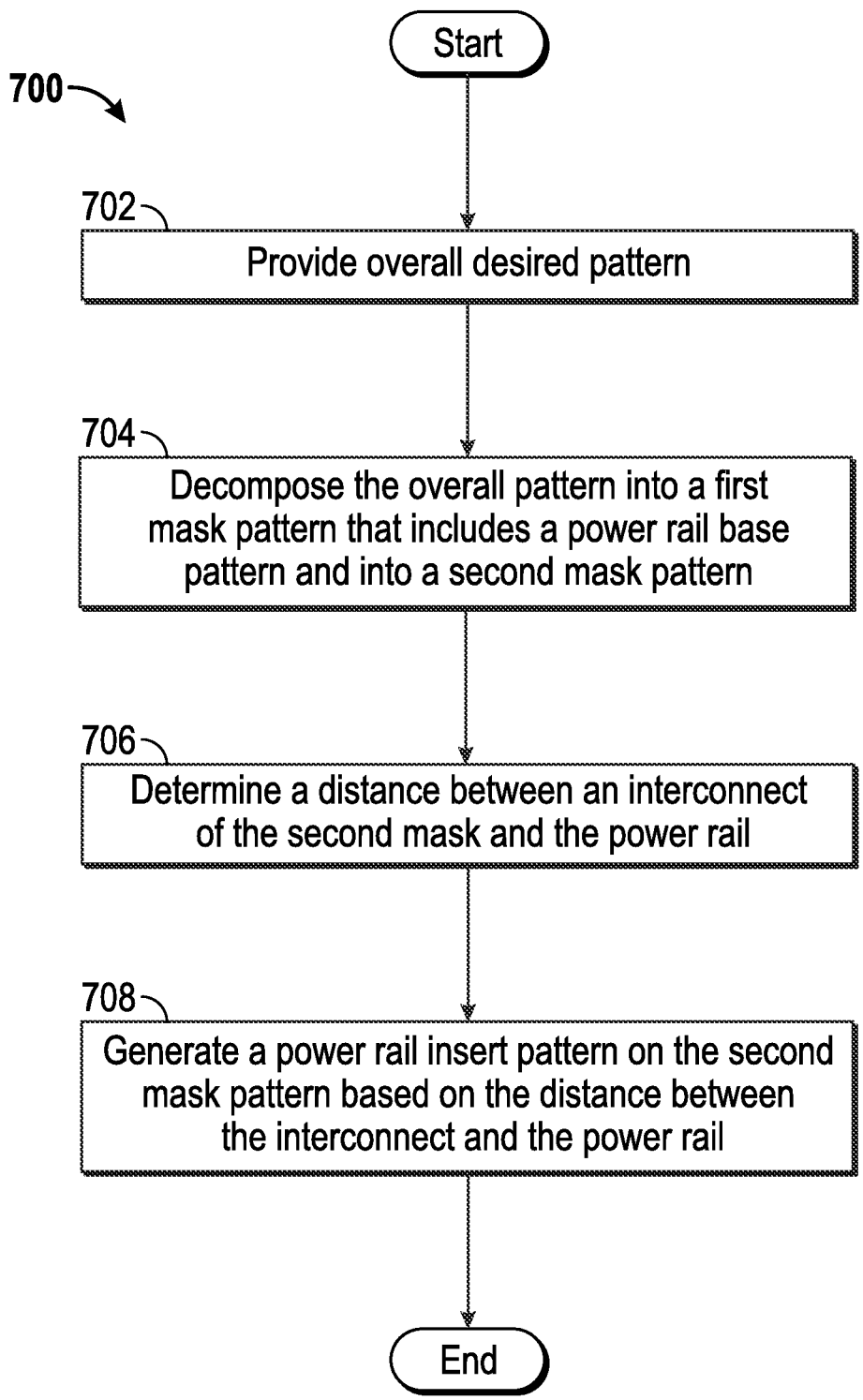
FIG. 10 is a flow diagram illustrating a method according to embodiments.

The exemplary multiple mask solution described here uses at least two masks for a multiple patterning procedure on a semiconductor device structure. In this regard, FIG. 10 is a flow chart that illustrates an exemplary embodiment of a mask generation process 700 that can be executed to create a set of mask patterns for use during a semiconductor manufacturing process. The various steps performed in connection with process 700 may be performed by software, hardware, firmware, or any combination thereof. In practice, portions of process 700 may be performed by one or more computing devices, computer systems, or processing hardware that is suitably configured to execute an appropriate software program having computer-readable and/or processor-executable instructions that, when executed, cause the host computing device or processor to carry out the described steps. For example, the process 700 could be incorporated or integrated into a computer-aided design application suitable for use with semiconductor device designs, a design rule checking application appropriate for semiconductor device designs, or the like. It should be appreciated that process 700 may include any number of additional or alternative steps, the steps shown in FIG. 10 need not be performed in the illustrated order, and process 700 may be incorporated into a more comprehensive procedure or process having additional functionality not described in detail herein. Furthermore, some embodiments of the process 700 may omit one or more of the steps illustrated in FIG. 10 (as long as the overall functionality is preserved).

The process 700 may begin by obtaining, creating, or providing an initial design for an overall desired mask pattern in step 702. In certain CAD deployments, step 702 may provide preliminary data that represents the desired mask pattern, where the preliminary data indicates the layout, dimensions, arrangement, orientation, and relative positioning of the features defined by the overall mask pattern (using any suitable reference or coordinate system, as is well understood). This example contemplates the creation of features corresponding to the overall pattern 100 shown in FIG. 1A. Accordingly, step 702 may provide, obtain, or store data indicative of the desired layout of the power rails 114, 116 and the interconnects 128, 129, 130, 132.

In the embodiment provided, the process 700 employs an LELEE procedure. Accordingly, the overall pattern is decomposed into a first mask pattern that includes a power rail base pattern and a second mask pattern at step 704. Although this example decomposes the overall mask pattern into a first component mask pattern and a second component mask pattern, any number of component mask patterns may be generated. For example, the overall pattern 100 may be decomposed into the first mask pattern 102 and the internal pattern 112b portion of the second mask pattern 104. The features on both of these mask patterns are "negative" because the resulting patterns of photoresist material that are formed on the semiconductor substrate will include spaces or holes having outlines that correspond to the mask features. In other words, there will be a lack of photoresist material wherever the mask features appear in FIG. 1B and FIG. 1C.

The process 700 determines a distance between the power rail and an interconnect on the second mask pattern. The distance may be determined at various locations along a longitudinal direction of the power rail. For example, the process 700 may determine the distances 134, 135.

The process 700 generates an insert pattern on the second mask based on the distance determined in step 708. For example, the process 700 may select between narrow inserts 138A and wide inserts 138B based on the distances 134, 135. The process 700 may be associated with a suitable design rule check (DRC) procedure that determines the presence of tip-to-tip and/or tip-to-line violations in the component mask patterns. Thus, step 708 may be performed by appropriate processing hardware that analyzes data indicative of the component mask patterns using an appropriate DRC application, program, or algorithm. The process 700 may then save data corresponding to the mask patterns that may be used to generate/create photolithographic masks. These masks are then utilized to form certain semiconductor device features during fabrication of a semiconductor device. In this regard, an exemplary fabrication process is described below with reference to FIG. 11.

FIG. 11 illustrates a flow chart of a process 800 that may be employed to manufacture a semiconductor device having improved uniformity of feature dimensions. For simplicity and consistency, this fabrication process 800 utilizes the two photolithographic masks above in a litho-etch-litho-etch-etch (LELEE) process. Thus, the exemplary fabrication process 800 described here may be used to create device features on a semiconductor device structure, such as the semiconductor device 201 of the apparatus 200.

A semiconductor wafer is provided in step 810. The semiconductor wafer may include various layers of an integrated circuit formed over a semiconductor material. The layers include patterned layers of the integrated circuit, an insulating layer, and a hard mask material formed over the insulating material. The semiconductor material may be a silicon material as typically used in the semiconductor industry, e.g., relatively pure silicon as well as silicon admixed with other elements such as germanium, carbon, and the like. In some embodiments, the semiconductor material may be germanium, gallium arsenide, or the like.

The insulating material is a layer into which metal will be deposited to form the power rail and interconnects. The insulating material may be any suitable material, such as an oxide material. For example, the oxide material may be a tetraethyl orthosilicate (TEOS) oxide, a high density plasma oxide, or the like. The insulating layer is formed using, for example, an appropriate deposition technique, such as chemical vapor deposition (CVD), low pressure CVD (LP-CVD), plasma enhanced CVD (PECVD), atmospheric pressure CVD (APCVD), physical vapor deposition (PVD), atomic layer deposition (ALD), or the like. The hard mask material may any suitable material, such as a nitride material. For example, the hard mask material may be silicon nitride, silicon carbide, oxygen doped silicon carbide, nitrogen doped silicon carbide, oxygen doped silicon nitride, carbon doped silicon nitride, and oxygen and carbon doped silicon nitride.

At step 812 a first mask having a power rail base pattern is provided. For example, a photolithographic mask that includes the mask pattern 102 with the power rail base pattern 136 may be provided. An image of the first mask is then transferred to the wafer in steps 814, 816, and 818. The image of the first mask that includes the power rail base pattern is developed on a first photoresist placed overtop the hard mask material in step 814 and the photoresist is developed in step 816. The first mask image is then etched into the wafer is step 818. For example, the developed first photoresist may be used as an etch mask to etch the image of the first mask into the hard mask material of the wafer. Suitable chemical and/or physical etching techniques and etch chemistries may be used, including, without limitation: fluorine based plasma etch; reactive ion etch; fluorine-based chemistry etching, alternatively argon and oxygen.

A second mask having a power rail insert pattern is provided in step 820. For example, a photolithographic mask that includes the mask pattern 104 with the insert pattern 138 may be provided. An image of the second mask is then transferred to the wafer in steps 822, 824, and 826. In the example provided, the image of the second mask that includes the power rail insert pattern is exposed on a second photoresist on the wafer in step 822 and the second photoresist is developed in step 824. The second mask image is then etched into the wafer is step 826. For example, the developed second photoresist may be used as an etch mask to etch the image of the first mask into the hard mask material of the wafer. Although the etch chemicals are selected to predominantly etch the nitride material rather than the oxide material, the underlying oxide insulating layer is slightly etched by the etching steps 818 and 826. Accordingly, the areas where the insert pattern overlies the base pattern of the power rail may include a stepped cross section where the oxide insulating layer is etched twice by the etch chemical selected to etch the nitride mask material.

Trenches are etched into the wafer in step 830. For example, the hard mask material may be used as an etch mask to etch a combined image into the insulating layer. The etching may be limited by an etch stop material underlying the insulating layer, such as another nitride layer. In some embodiments, different lithography processes are utilized that may include different numbers of etching steps, freezing steps, or other suitable steps and techniques corresponding to the particular multiple pattern lithographic process utilized.

Electrically conductive material is deposited in step 820 to print the overall mask pattern. For example, the etched trenches corresponding to the images of the first and second masks 102, 104 may be filled with a metal material to form the power rail 114 and the interconnects 128, 129, 130, 132. In some embodiments, the trenches are completely filled with the electrically conductive material. In some embodiments, fabrication process 800 "overfills" the trenches, resulting in some overburden material overlying the layer of insulating material. In some embodiments, the electrically conductive material is a metal material (e.g., a tungsten material, a copper material, or the like) that is deposited using, for example, a CVD process, a sputtering process, or the like. When the trenches have been overfilled, the fabrication process 800 removes the overburden portion of the electrically conductive material using, for example, a chemical mechanical polishing procedure that stops after the upper surface of the layer of insulating material has been exposed. Accordingly, the exposed surface of the electrically conductive material is substantially planar with the exposed surface of the layer of insulating material.

A data structure representative of a computer system and/or portions thereof included on a computer readable storage medium may be a database or other data structure which can be read by a program and used, directly or indirectly, to fabricate the hardware comprising the computer system. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the computer system. The netlist may then be placed and routed to produce a data set describing geometric shapes to be applied to masks. The masks may then be used in various semiconductor fabrication steps to produce a semiconductor circuit or circuits corresponding to the computer system. Alternatively, the database on the computer readable storage medium may be the netlist (with or without the synthesis library) or the data set, as desired, or Graphic Data System (GDS) II data.

The method illustrated in FIG. 10 may be governed by instructions that are stored in a non-transitory computer readable storage medium and that are executed by at least one processor of the computer system. Each of the operations shown in FIG. 10 may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions including code and data structures stored on the non-transitory computer readable storage medium may be in source code, assembly language code, object code, or other instruction format that is interpreted and/or executable by one or more processors.

The provided systems and methods have several beneficial attributes that promote a large process window and uniformity of critical dimensions. Accordingly, improved chip level yield and improved flexibility of cell placement and signal interconnect coloring may be achieved. Furthermore, the uniformity may improve performance and manufacturability of computer systems that include various embodiments according to the disclosure.

Embodiments have been described herein in an illustrative manner, and it is to be understood that the terminology which has been used is intended to be in the nature of words of description rather than of limitation. Obviously, many modifications and variations are possible in light of the above teachings. Various implementations may be practiced otherwise than as specifically described herein, but are within the scope of the appended claims.

What is claimed is:

1. A method comprising:
   decomposing an overall pattern into:
      a first mask pattern that includes a power rail base pattern; and
      a second mask pattern; and
   generating, on the second mask pattern, a power rail insert pattern that is at least partially aligned with the power rail base pattern of the first mask pattern, the generating comprising:
      selecting, for the power rail insert pattern, one or more inserts to be used to overlay the power rail base pattern of the first mask pattern; and
      adding, to the second mask pattern, the one or more inserts in an arrangement in which the one or more inserts improve an exposure dose balance for corresponding regions of a power rail in a semiconductor wafer that is fabricated using the first mask pattern and the second mask pattern.

2. The method of claim 1, wherein decomposing the overall pattern includes decomposing the power rail base pattern into an area of a first power rail on the first mask pattern and decomposing the power rail base pattern into an area of a second power rail on the first mask pattern, and
   wherein generating the power rail insert pattern includes generating a first insert pattern at the area of the first power rail on the second mask pattern and generating a second insert pattern at the area of the second power rail on the second mask pattern.

3. The method of claim 1, further including selecting a dimension of at least one of the one or more inserts of the power rail insert pattern based on a distance between the power rail base pattern and a feature of a cell that is patterned in the second mask pattern.

4. The method of claim 1, wherein decomposing the overall pattern includes decomposing interconnect patterns of the overall pattern between the first mask pattern and the second mask pattern, and wherein generating the power rail insert pattern includes generating the power rail insert pattern based on a distance between the power rail base pattern and a nearest one of the interconnect patterns on the second mask pattern.

5. The method of claim 1, further comprising:
providing the overall pattern, the overall pattern including a plurality of cell patterns that each include a portion of the power rail base pattern, and
wherein decomposing the overall pattern includes decomposing the overall pattern into the power rail base pattern that is partially disposed in each of the cell patterns, and
wherein generating the power rail insert pattern includes generating two or more inserts that are separated along a longitudinal direction of the power rail base pattern.

6. The method of claim 5, further including selecting a dimension of each of the two or more inserts based on a distance in a transverse direction between each of the two or more inserts and a nearest interconnect pattern on the second mask pattern that is aligned in the longitudinal direction with a respective insert of the two or more inserts whose dimension is to be selected.

7. The method of claim 1, further including selecting a size of the power rail insert pattern based on an exposure dose skew between the first mask pattern and the second mask pattern.

8. The method of claim 1, wherein generating the power rail insert pattern includes generating two or more inserts that are separated along a transverse direction of the power rail base pattern to conform to stitching rules of a lithographic process.

9. The method of claim 1, further including creating a first photolithographic mask that includes the first mask pattern and creating a second photolithographic mask that includes the second mask pattern.

10. The method of claim 1, further including fabricating a semiconductor device using a first photolithographic mask that includes the first mask pattern and a second photolithographic mask that includes the second mask pattern.

11. A method of fabricating a semiconductor device, comprising:
providing a semiconductor wafer;
providing a first photolithographic mask that includes a first image having a power rail base pattern;
transferring the first image onto the wafer;
providing a second photolithographic mask that includes a second image having a power rail insert pattern disposed to align within the power rail base pattern of the first photolithographic mask, the power rail insert pattern comprising one or more inserts to be used to overlay the power rail base pattern of the first image, the one or more inserts placed in the second image in an arrangement in which the one or more inserts improve an exposure dose balance for corresponding regions of a power rail in a semiconductor wafer that is fabricated using the first image and the second image;
transferring the second image onto the wafer;
etching a plurality of trenches in the wafer using the transferred first image and the transferred second image as an etch mask; and
depositing a conductive material in the trenches of the wafer to print the power rail.

12. The method of claim 11, wherein providing the semiconductor wafer further includes providing the semiconductor wafer having an insulating layer and a hard mask layer disposed on the insulating layer; and wherein transferring the first image includes:
exposing the first image of the first photolithographic mask on a first photoresist disposed on the wafer;
developing the first photoresist to form a first etch mask that includes the power rail base pattern; and
etching the first image into the hard mask layer using the first etch mask.

13. The method of claim 12, wherein transferring the second image includes:
exposing the second image of the second photolithographic mask on a second photoresist disposed on the wafer;
developing the second photoresist to form a second etch mask that includes the power rail insert pattern; and
etching the second image into the hard mask layer using the second etch mask.

14. The method of claim 13, wherein etching the plurality of trenches in the wafer includes etching the insulating layer using the hard mask layer as a hard etch mask.

* * * * *